United States Patent
Joshi et al.

(10) Patent No.: US 9,484,283 B2
(45) Date of Patent: Nov. 1, 2016

(54) MODULAR JET IMPINGEMENT COOLING APPARATUSES WITH EXCHANGEABLE JET PLATES

(71) Applicants: Toyota Motor Engineering & Manufacturing North America, Inc., Erlanger, KY (US); Purdue University, West Lafayette, IN (US)

(72) Inventors: Shailesh N. Joshi, Ann Arbor, MI (US); Ercan Mehmet Dede, Ann Arbor, MI (US); Matthew Joseph Rau, Lafayette, IN (US); Mayur Prakash Gaikwad, Houghton, MI (US); Suresh V. Garimella, W. Lafayette, IN (US)

(73) Assignee: Toyota Motor Engineering & Manufacturing North America Inc., Erlanger, KY (US)

( * ) Notice: Subject to any disclaimer, the term of this patent is extended or adjusted under 35 U.S.C. 154(b) by 759 days.

(21) Appl. No.: 13/734,615

(22) Filed: Jan. 4, 2013

(65) Prior Publication Data
US 2014/0190665 A1    Jul. 10, 2014

(51) Int. Cl.
*H01L 23/473* (2006.01)
*H01L 23/427* (2006.01)

(52) U.S. Cl.
CPC ......... *H01L 23/4735* (2013.01); *H01L 23/427* (2013.01); *H01L 2924/0002* (2013.01)

(58) Field of Classification Search
CPC ............ F28D 15/0266; F28D 15/0263; F28F 9/0265; H01L 23/4735; H01L 23/4336; H05K 7/20309; H05K 7/20345
USPC ............. 165/104.21, 104.33, 174, 80.4, 908; 361/679.46–679.54, 688–723; 239/135, 136, 548, 554, 555, 589
See application file for complete search history.

(56) References Cited

U.S. PATENT DOCUMENTS 3,302,699 A * 2/1967 Hedentorp et al. ............. 165/95
4,583,582 A     4/1986 Grossman
(Continued)

FOREIGN PATENT DOCUMENTS

JP     10121110    5/1998
WO    98/44307    10/1998
(Continued)

OTHER PUBLICATIONS

Z. Q. Chen et al., "An experimental study of two phase flow and boiling heat transfer in bi-dispersed porous channels," available at http://www.me.ust.hk/~mezhao/pdf/49.PDF.
(Continued)

*Primary Examiner* — Len Tran
*Assistant Examiner* — For K Ling
(74) *Attorney, Agent, or Firm* — Dinsmore & Shohl LLP (57) ABSTRACT

Modular cooling apparatuses are disclosed. In one embodiment, a cooling apparatus includes an inlet manifold, a jet plate manifold, a plurality of jet plates, a vapor manifold, and a target layer. The inlet manifold includes a fluid distribution chamber, and a plurality of fluid distribution channels symmetrically located within the fluid distribution chamber. The jet plate manifold is coupled to the inlet manifold such that the plurality of jet plate openings is vertically aligned with respect to the plurality of fluid distribution channels. The plurality of jet plates is removably disposed in the jet plate manifold. The vapor manifold has a plurality of walls that define a vapor manifold opening and at least one outlet channel through at least one of the walls. The target layer is coupled to the vapor manifold such that the jet orifice surface of each jet plate is positioned above the target layer.

20 Claims, 7 Drawing Sheets

(56) References Cited

U.S. PATENT DOCUMENTS

| | | | |
|---|---|---|---|
| 5,067,047 A | | 11/1991 | Azar |
| 5,183,104 A | * | 2/1993 | Novotny .................. 165/104.33 |
| 5,263,536 A | * | 11/1993 | Hulburd et al. ............. 165/80.4 |
| 5,310,440 A | * | 5/1994 | Zingher .................... 156/345.11 |
| 5,349,831 A | * | 9/1994 | Daikoku et al. ................ 62/376 |
| 5,402,004 A | | 3/1995 | Ozmat |
| 6,123,145 A | | 9/2000 | Glezer et al. |
| 6,366,462 B1 | * | 4/2002 | Chu et al. ..................... 361/699 |
| 6,498,725 B2 | * | 12/2002 | Cole et al. .................... 361/700 |
| 6,650,542 B1 | * | 11/2003 | Chrysler et al. ............. 361/699 |
| 6,857,283 B2 | * | 2/2005 | Tilton et al. ................. 62/259.2 |
| 6,952,346 B2 | | 10/2005 | Tilton et al. |
| 6,986,382 B2 | | 1/2006 | Upadhya et al. |
| 6,988,535 B2 | | 1/2006 | Upadhya et al. |
| 7,073,569 B1 | * | 7/2006 | Joshi et al. ............. 165/104.33 |
| 7,269,011 B2 | * | 9/2007 | Bhatti et al. .................. 361/699 |
| 7,277,283 B2 | | 10/2007 | Campbell et al. |
| 7,362,574 B2 | * | 4/2008 | Campbell et al. ........... 361/699 |
| 7,375,962 B2 | | 5/2008 | Campbell et al. |
| 7,511,957 B2 | * | 3/2009 | Campbell et al. ........... 361/699 |
| 7,521,029 B2 | * | 4/2009 | Guetlhuber et al. .......... 422/201 |
| 7,530,778 B2 | | 5/2009 | Yassour et al. |
| 7,571,618 B2 | | 8/2009 | Dessiatoun |
| 7,597,135 B2 | | 10/2009 | Ghosh et al. |
| 7,639,030 B2 | | 12/2009 | Wadell |
| 7,762,314 B2 | | 7/2010 | Campbell et al. |
| 7,841,843 B2 | | 11/2010 | Cho et al. |
| 7,885,074 B2 | | 2/2011 | Campbell et al. |
| 7,916,483 B2 | * | 3/2011 | Campbell et al. ........... 361/702 |
| 7,921,664 B2 | | 4/2011 | Rini et al. |
| 7,942,997 B2 | | 5/2011 | Rivas et al. |
| 7,992,627 B2 | | 8/2011 | Bezama et al. |
| 8,059,405 B2 | | 11/2011 | Campbell et al. |
| 8,074,706 B2 | | 12/2011 | Su et al. |
| 8,077,460 B1 | * | 12/2011 | Dede et al. .................. 361/699 |
| 8,081,461 B2 | | 12/2011 | Campbell et al. |
| 8,104,533 B2 | * | 1/2012 | Rini et al. .................... 165/80.4 |
| 8,118,084 B2 | | 2/2012 | Harvey |
| 8,194,406 B2 | | 6/2012 | Campbell et al. |
| 8,391,008 B2 | | 3/2013 | Dede |
| 2002/0152761 A1 | * | 10/2002 | Patel et al. ................... 62/259.2 |
| 2007/0084587 A1 | | 4/2007 | Huang et al. |
| 2007/0119565 A1 | | 5/2007 | Brunschwiler et al. |
| 2010/0044018 A1 | | 2/2010 | Furberg et al. |
| 2010/0097760 A1 | | 4/2010 | Azar et al. |
| 2011/0146955 A1 | | 6/2011 | Chen |
| 2011/0272120 A1 | | 11/2011 | Joshi et al. |
| 2012/0048515 A1 | * | 3/2012 | Bhunia et al. ........... 165/104.25 |
| 2012/0097368 A1 | | 4/2012 | Chen et al. |
| 2012/0168145 A1 | | 7/2012 | Peterson et al. |
| 2012/0170222 A1 | | 7/2012 | Dede |
| 2012/0181005 A1 | | 7/2012 | Downing |
| 2012/0212907 A1 | | 8/2012 | Dede |
| 2012/0279684 A1 | | 11/2012 | Keisling et al. |
| 2013/0020059 A1 | | 1/2013 | Park |

FOREIGN PATENT DOCUMENTS

| | | |
|---|---|---|
| WO | WO9844307 | 10/1998 |
| WO | WO2005029555 | 3/2005 |

OTHER PUBLICATIONS

Palm et al., "Enhancement of Boiling Heat transfer by Application of a Porous Layer," available at: http://www.energy.kth.se/index.asp?pnr=10&ID=125&lang=0.

Zhao, Zenghui, "Enhanced heat transfer with jet impingement on structured-porous surfaces," available at http://ieeexplore.ieee.org/xpl/login.jsp?tp=&arnumber=6231577&url=http%3A%2F%2Fieeexplore.ieee.org%2Fxpls%2Fabs_all.jsp%3Farnumber%3D6231577.

J. P. Li, et al., Porous Ti6Al4V scaffold directly fabricating by rapid prototyping: Preparation and in vitro experiment; Science Direct; Biomaterials 27 (2006) 1223-1235.

Brunschwiler, T., H. et al., "Direct Liquid Jet-Impingement Cooling with Micron-Sized Nozzle Array and Distributed Return Architecture", IBM Research GmbH, Zurich Research Laboratory, pp. 196-203, 2006.

Arslan, Selin, "Micro-Evaporator Design and Investigation of Phase Change in Tailored Microchannels", Columbia University, 2011.

El-Sheikh, H., Garimella, S., "Heat Transfer from Pin-Fin Heat Sinks under Multiple Impinging Jets," IEEE Transactions on Advanced Packaging, vol. 23-1, 2000: 113-120.

http://digitalcommons.mcmaster.ca/cgi/viewcontent.cgi?article=7365&context=opendissertations; "Effect of surface finish on boiling heat transfer at stagnation point under free liquid jet impingement" .

http://www.sciencedirect.com/science/article/pii/S0017931098003378; "An experimental study of slot jet impingement cooling on concave surface: effects of nozzle configuration and curvature" .

Amon, Cristina H., S. C. Yao, C.F. Wu, and C. C. Hsieh. "Microelectromechanical System-Based Evaporative Thermal Management of High Heat Flux Electronics." Journal of Heat Transfer, 2005:66-75.

Brignoni, L., Garimella, S., "Performance Characteristics of Confined Impinging Air Jets with Surface Enhancement," Advances in Electronic Packaging, vol. 26-2, 1999: 2009-2014.

Lay, J. H., and V.K. Dhir. "Nucleate Boiling Heat Flux Enhancement on Macro/Micro-Structured Surfaces Cooled by an Impinging Jet." Journal of Enhanced Heat Transfer, 1995: 177-88.

Sung, M. K., Mudawar, I., "Single-phase and two-phase cooling using hybrid micro-channel/slot-jet module." Int. J. of Heat and Mass Transfer, 51, 2008: 3825-2839.

U.S. Appl. No. 13/683,660, filed Nov. 21, 2012 entitled "Cooling Apparatuses Having Sloped Vapor Outlet Channels".

https://engineering.purdue.edu/CTRC/research/projects/A_JetImpingement_oneslider2011.pdf; "Two-Phase Liquid Jet Impingement Cooling"; S. V. Garimella, D.A. West; Purdue University, Cooling Technologies Research Center.

https://www.lboro.ac.uk/research/iemrc/documents/EventsDocuments/3rd%20conference%202008/Presentations/opt%20cooling%20Skuriat%20notts.pdf; "Optimum Cooling Solutions for Power Electronics"; Robert Skuriat, Nottingham University, Jul. 4, 2008.

Brunschwiler, T., H. Rothuizen, M. Fabbri, U. Kloter, B. Michel, R.J. Benzama, and G. Natarajan. Direct Liquid Jet-Impingement Cooling With Micron-Sized Nozzle Array and Distributed Return Architecture. Proc. of the Tenth Intersociety Conference on Thermal and Thermomechanical Phenomena in Electronics Systems, San Diego, CA, 2006: 196-203.

Wadsworth, D.C., Mudawar, I., "Cooling of a Multichip Electronic Module by Means of Confined Two-Dimensional jets of dielectric liquid," Transactions of the ASME Journal of Heat Transfer, vol. 112, 1990: 891-898.

Ei-Sheikh, H., Garimella, S., "Heat Transfer from Pin-Fin Heat Sinks under Multiple Impinging Jets," IEEE Transactions on Advanced Packaging, vol. 23-1, 2000: 113-120.

http://academiccommons.columbia.edu/catalog/ac%3A131465; "Micro-Evaporator Design and Investigation of Phase Change in Tailored Microchannels"; Selin Arslan; Graduate School of Arts and Sciences, Columbia University, 2011.

http://digitalcommons.mcmaster.ca/cgi/viewcontent.cgi?article=7365&context=opendissertations; "Effect of surface finish on boiling heat transfer at stagnation point under free liquid jet impingement".

http://www.sciencedirect.com/science/article/pii/S0017931098003378; "An experimental study of slot jet impingement cooling on concave surface: effects of nozzle configuration and curvature".

* cited by examiner

MODULAR JET IMPINGEMENT COOLING APPARATUSES WITH EXCHANGEABLE JET PLATES

TECHNICAL FIELD

The present specification generally relates to cooling apparatuses for cooling heat generating devices and, more particularly, to modular jet impingement, two-phase cooling apparatuses having exchangeable jet plates.

BACKGROUND

Heat generating devices, such as power semiconductor devices, may be coupled to a heat spreader to remove heat and lower the maximum operating temperature of the heat generating device. In some applications, cooling fluid may be used to receive heat generated by the heat generating device by convective thermal transfer, and remove such heat from the heat generating device. For example, jet impingement may be used to cool a heat generating device by directing impingement jets of coolant fluid onto the heat generating device or a target surface that is thermally coupled to the heat generating device. The impingement jets are created by forcing coolant fluid through one or more jet orifices. Additionally, jet impingement may also be combined with two-phase cooling, where the heat generating device is cooled by the phase change of the coolant fluid from a liquid to a vapor.

The geometry of individual jet orifices, as well as the arrangement of the jet orifices (i.e., a jet orifice pattern), affect the cooling performance of the cooling apparatus. Additionally, different heat generating devices may produce different heat fluxes, and may have different hot spots or zones that need to be cooled by precise impingement of the impingement jets. However, a significant amount of time and cost must go into designing and building prototypes to develop the optimum jet orifice geometry and jet orifice pattern for the various cooling applications.

Accordingly, a need exists for alternative jet impingement, two-phase cooling apparatuses that reduce the time and cost of evaluating jet orifice geometries and patterns.

SUMMARY

In one embodiment, a cooling apparatus includes an inlet manifold, a jet plate manifold coupled to the inlet manifold, a plurality of jet plates disposed within the jet plate manifold, a vapor manifold coupled to the jet plate manifold, and a target layer coupled to the vapor manifold. The inlet manifold includes a fluid distribution chamber, and a plurality of fluid distribution channels symmetrically located within the fluid distribution chamber. The jet plate manifold includes a plurality of jet plate openings. The jet plate manifold is coupled to the inlet manifold such that the plurality of jet plate openings is vertically aligned with respect to the plurality of fluid distribution channels. The plurality of jet plates is disposed within the plurality of jet plate openings. Each jet plate of the plurality of jet plates includes a jet orifice surface and a jet channel. The jet orifice surface includes one or more jet orifices, and the jet channel is fluidly coupled to an individual fluid distribution channel of the plurality of fluid distribution channels. The coolant fluid flows through the one or more jet orifices as one or more impingement jets. The vapor manifold has a plurality of walls that define a vapor manifold opening and at least one outlet channel through at least one wall of the plurality of walls. At least a portion of each jet plate is disposed within the vapor manifold opening. The target layer is coupled to the vapor manifold such that the jet orifice surface of each jet plate is positioned above the target layer.

In another embodiment, a cooling apparatus includes an inlet manifold, a jet plate manifold coupled to the inlet manifold, a plurality of jet plates disposed within the jet plate manifold, a vapor manifold coupled to the jet plate manifold, and a target layer coupled to the vapor manifold. The inlet manifold includes a fluid distribution chamber, a plurality of fluid distribution channels symmetrically located within the fluid distribution chamber, and a fluid routing feature centrally positioned on a floor of the fluid distribution chamber. The fluid routing feature receives coolant fluid and directs the coolant fluid toward the plurality of fluid distribution channels. The jet plate manifold includes a plurality of jet plate openings, wherein the jet plate manifold is coupled to the inlet manifold such that the plurality of jet plate openings is vertically aligned with respect to the plurality of fluid distribution channels. The plurality of jet plates is removably disposed within the plurality of jet plate openings. Each jet plate of the plurality of jet plates includes a jet orifice surface having one or more jet orifices, and a jet channel that is fluidly coupled to an individual fluid distribution channel of the plurality of fluid distribution channels. The coolant fluid flows through the one or more jet orifices as one or more impingement jets. The vapor manifold has a plurality of walls that define a vapor manifold opening, and at least one outlet channel through at least one wall of the plurality of walls. At least a portion of each jet plate is disposed within the vapor manifold opening. The target layer is coupled to the vapor manifold such that the jet orifice surface of each jet plate is positioned above the target layer.

In yet another embodiment, a cooling apparatus includes a fluid inlet layer, an inlet manifold coupled to the fluid inlet layer, a jet plate manifold coupled to the inlet manifold, a plurality of jet plates disposed within the jet plate manifold, a vapor manifold coupled to the jet plate manifold, a target layer coupled to the vapor manifold, and an insulation assembly coupled to the target layer and the vapor manifold. The fluid inlet layer has a fluid inlet for providing coolant fluid to the cooling apparatus. The inlet manifold includes a fluid distribution chamber and a plurality of fluid distribution channels symmetrically located within the fluid distribution chamber. The inlet manifold is coupled to the fluid inlet layer such that the fluid inlet is fluidly coupled to the fluid distribution chamber. The jet plate manifold includes a plurality of jet plate openings having a seat for positioning the jet plate manifold. The jet plate manifold is coupled to the inlet manifold such that the plurality of jet plate openings is vertically aligned with respect to the plurality of fluid distribution channels. The plurality of jet plates is disposed within the plurality of jet plate openings. Each jet plate of the plurality of jet plates includes a flange portion, a jet orifice surface opposite from the flange portion, and a jet channel. The plurality of jet plates is disposed within the plurality of jet plate openings such that the flange portion is positioned on the seat. The jet orifice surface has one or more jet orifices. The jet channel is fluidly coupled to an individual fluid distribution channel of the plurality of fluid distribution channels, and the coolant fluid flows through the one or more jet orifices as one or more impingement jets. The vapor manifold has a plurality of walls that define a vapor manifold opening, and at least one outlet channel through at least one wall of the plurality of walls. At least a portion of each jet plate is disposed within the vapor manifold opening. The target layer is coupled to the vapor manifold such that the jet orifice surface of each jet plate is positioned above the target layer. The insulation assembly includes a plurality of recesses for receiving a plurality of heat generating devices.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to modular jet impingement, two-phase cooling apparatuses that may be utilized to cool heat generating devices, such as semiconductor devices. Jet impingement cooling is provided by directing jets of coolant fluid at an impingement region of a target surface, which may be a heat generating device or a thermally conductive surface coupled to the heat generating device. Heat is transferred to the coolant fluid. Different heat generating devices may require different impingement jet patterns for optimal cooling. Accordingly, a jet orifice surface should be designed to have a jet orifice pattern that optimally cools the particular heat generating device to be cooled. Additionally, in two-phase heat transfer systems, the coolant fluid changes phase from a liquid to a vapor, thereby removing heat flux from the heat generating device.

Embodiments described herein have a modular design that allows different shapes, sizes and patterns of jet orifices to be tested experimentally during the design process. In some embodiments, a cooling apparatus includes an inlet manifold that equally distributes coolant fluid to different jet plates under evaluation. Different jet plates providing different jet orifice patterns may be easily exchanged and evaluated. Accordingly, the modular design provides for the assembly of parallel multiple jet impingement cooling structures into one modular cooling apparatus. Although embodiments of the present disclosure are described in the context of cooling apparatuses for design and evaluation purposes, embodiments of the present disclosure may also be utilized in production and deployed in actual electrical systems. Various embodiments of cooling apparatuses having a modular design are described in detail below.

Figure 1:
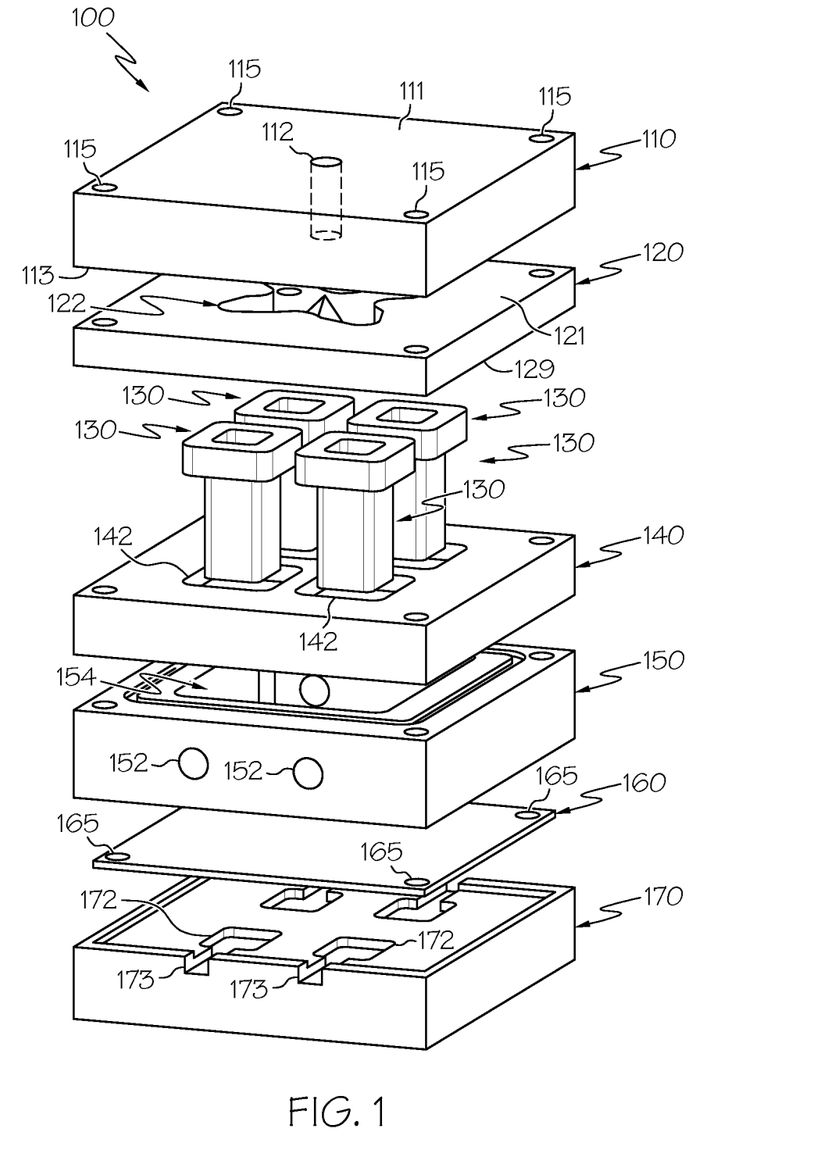
FIG. 1 schematically depicts an exploded view of a disassembled exemplary cooling apparatus according to one or more embodiments described and illustrated herein.

Referring now to FIG. 1, an exemplary cooling apparatus 100 is depicted in an exploded view. Generally, the cooling apparatus 100 comprises a fluid inlet layer 110, an inlet manifold 120, a plurality of jet plates 130 (i.e., jet nozzles), a jet plate manifold 140 (i.e., a jet nozzle manifold), a vapor manifold 150, a target layer 160 and an insulation assembly 170. Several gaskets may be provided between the various components to prevent coolant fluid from escaping the cooling apparatus 100. The cooling apparatus 100 is easily disassembled to change jet plates 130 for testing and evaluation.

As described in more detail below, the cooling apparatus 100 may be utilized to cool a heat generating device, such as a semiconductor device (not shown in FIG. 1). Semiconductor devices may include, but are not limited to, insulated gate bipolar transistors (IGBT), metal-oxide-semiconductor field effect transistors (MOSFET), power diodes, power bipolar transistors, power thyristor devices, and the like. As an example and not a limitation, the semiconductor device may be included in a power electronic module as a component in an inverter and/or converter circuit used to electrically power high load devices, such as electric motors in electrified vehicles (e.g., hybrid vehicles, plug-in hybrid electric vehicles, plug-in electric vehicles, and the like). The various components of the cooling apparatus 100 will now be sequentially described below with reference to FIG. 1 and FIGS. 2-7B.

Still referring to FIG. 1, the fluid inlet layer 110 comprises a fluid inlet 112 configured as a bore extending from a first surface 111 to a second surface 113 through the fluid inlet layer 110. The fluid inlet 112 may further include a fluid coupling for connecting the fluid inlet 112 to a fluid line (not shown) that may be further connected to a coolant fluid reservoir (not shown). Coolant fluid is provided to the cooling apparatus 100 through the fluid inlet 112. In some embodiments, the fluid inlet 112 may widen near the second surface 113. In the illustrated embodiment, the fluid inlet layer 110 includes four through-holes 115 for receiving fastener devices, such as screws, nuts, bolts, and the like, to removably couple the fluid inlet layer 110 to the remaining components of the cooling apparatus 100. It should be understood that more or fewer through-holes 115 may be provided than are illustrated in FIG. 1 and that the through-holes may be positioned at locations other than the corners of the fluid inlet layer 110. Additionally, in alternative embodiments, the fluid inlet layer 110 (as well as the other components) may not include through-holes. Rather, the various components of the cooling apparatus 100 may be removably coupled together by clamps or other fastener devices.

Figure 2A:
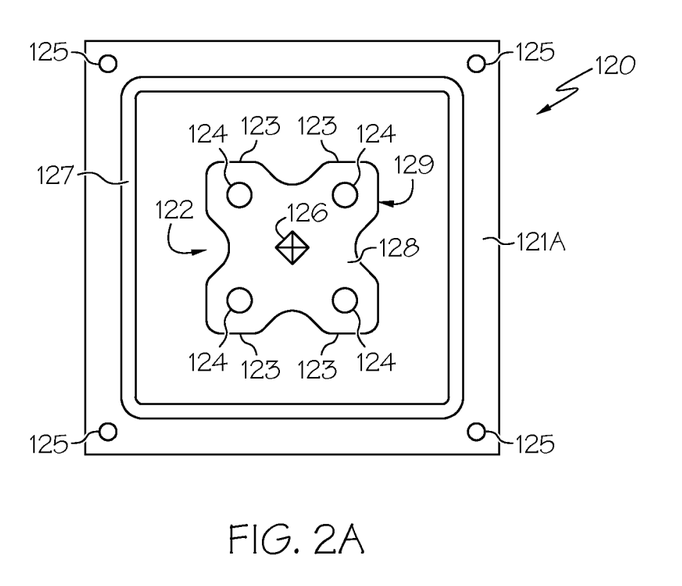
FIG. 2A schematically depicts a top view of an exemplary fluid inlet manifold according to one or more embodiments described and illustrated herein.
Figure 2B:
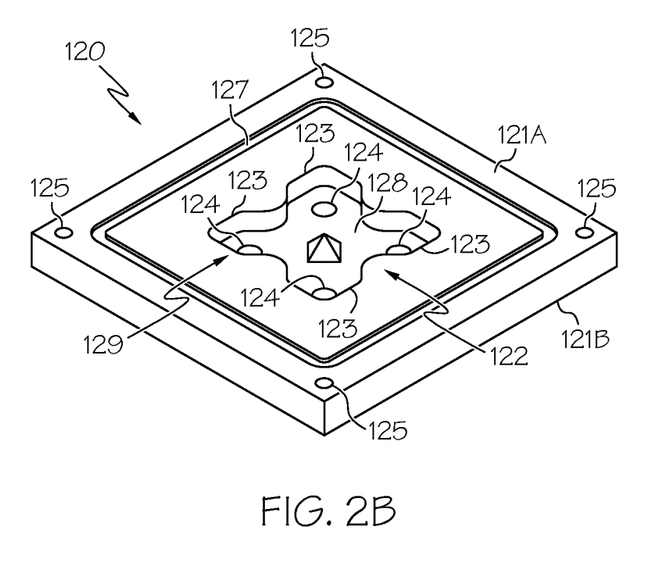
FIG. 2B schematically depicts a top perspective view of the exemplary fluid inlet manifold depicted in FIG. 2A.

Referring now to FIGS. 1 and 2A-2B, an exemplary fluid inlet manifold 120 is schematically depicted. FIG. 2A is a top view of the fluid inlet manifold 120, while FIG. 2B is a top perspective view of the fluid inlet manifold 120. The fluid inlet manifold 120 is removably coupled to the fluid inlet layer 110. For example, the illustrated fluid inlet manifold 120 also includes through-holes 125 to receive fasteners to couple the fluid inlet manifold 120 to the fluid inlet layer 110 and the jet plate manifold 140 that is described below.

The fluid inlet manifold 120 comprises a fluid distribution chamber 122 that is configured as a recess within a top surface 121A of the fluid inlet manifold 120. The fluid distribution chamber 122 includes a curved perimeter wall 129 that defines arms 123 surrounding a plurality of fluid distribution channels 124. The plurality of fluid distribution channels 124 is symmetrically located at a floor 128 of the fluid distribution chamber 122, and extends through the underside surface 121B of the fluid inlet manifold. As described in more detail below, the plurality of fluid distribution channels 124 evenly distribute coolant to the plurality of jet plates 130. Although four fluid distribution channels 124 are depicted in FIGS. 2A and 2B, more or fewer may be provided. The number of fluid distribution channels 124 depends on the number of jet plates 130 of the cooling apparatus 100.

The fluid inlet manifold 120 may also comprise a fluid routing feature 126 extending from the floor 128 of the fluid distribution chamber 122. The fluid routing feature 126 is located within the fluid distribution chamber 122 to receive coolant fluid from the fluid inlet 112 of the fluid inlet layer 110. Accordingly, the fluid routing feature 126 is vertically aligned with the fluid inlet 112 such that a stream of coolant fluid exiting the fluid inlet layer 110 strikes the fluid routing feature 126.

The fluid routing feature 126 is configured to evenly route the coolant fluid toward the plurality of fluid distribution channels 124 within the fluid distribution chamber 122. In the illustrated embodiment, there are four fluid distribution channels 124, and therefore, the illustrated fluid routing feature 126 has four sloping walls that face the four fluid distribution channels 124. The fluid routing feature 126 is shaped like a pyramid to evenly route coolant fluid to the fluid distribution channels 124. It should be understood that the fluid routing feature 126 may have other shapes where there are more or fewer fluid distribution channels 124. In alternative embodiments, the fluid routing feature 126 is not provided in the fluid distribution chamber 122.

The curved perimeter wall 129 is optimally shaped such that a fluid flow of the coolant fluid within the fluid distribution chamber 122 is substantially equal at each fluid distribution channel 124. The curved perimeter wall 129 defines an arm 123 of the fluid distribution chamber 122 around each fluid distribution channel 124. In this manner, each jet plate 130 will receive the same amount of coolant fluid at the same flow rate. Additionally, the curved perimeter wall 129 of the illustrated embodiment provides for low fluid flow resistance (i.e., minimized pressure drop) within the fluid distribution chamber 122 compared to a fluid distribution chamber with straight walls.

The illustrated fluid inlet manifold 120 includes perimeter groove 127 at the top and underside surfaces 121A, 121B that are operable to receive a gasket (not shown). The gaskets may be provided to prevent coolant fluid from leaking out of the cooling apparatus 100. Alternatively, no perimeter groove or gasket may be included.

Figure 3A:
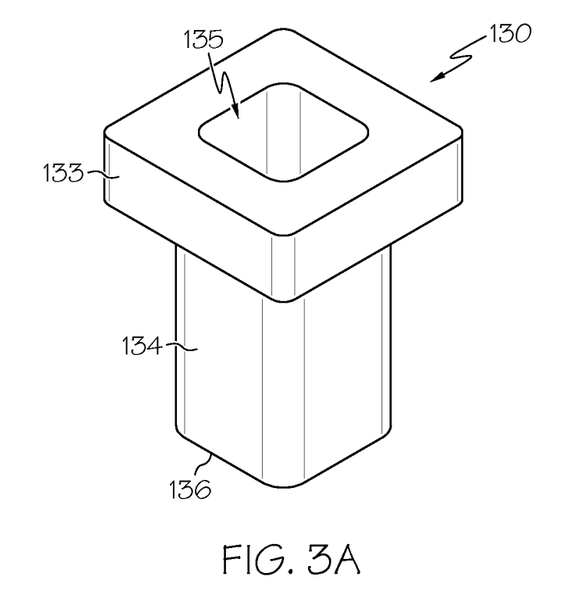
FIG. 3A schematically depicts a top perspective view of an exemplary jet plate according to one or more embodiments described and illustrated herein.
Figure 3B:
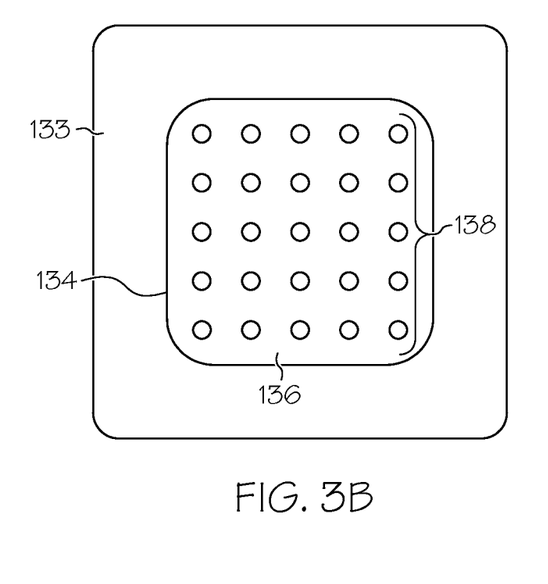
FIG. 3B schematically depicts a bottom view of the jet plate depicted in FIG. 3A.

FIG. 3A schematically depicts a perspective view of an exemplary jet plate 130, while FIG. 3B schematically depicts a bottom view of the individual jet plate 130 depicted in FIG. 3A. Generally, the illustrated jet plate 130 comprises a flange portion 133, and a narrow portion 134 extending from the flange portion 133. A jet orifice surface 136 is provided on an underside surface of the narrow portion 134. A jet channel 135 extends through the flange portion 133 and the narrow portion 134, and is fluidly coupled to a fluid distribution channel 124 of the fluid inlet manifold 120 when disposed in a jet plate opening 142 of the jet plate manifold 140, as described below.

The jet orifice surface 136 comprises a plurality of jet orifices 138 through which coolant fluid flows as impingement jets. As shown in FIG. 3B, the plurality of jet orifices 138 may be configured in a jet orifice pattern. The jet orifice pattern depicted in FIG. 4B is an array of circular jet orifices 138. Embodiments of the present disclosure allow for jet plates 130 having different jet orifice patterns to be tested and evaluated using the cooling apparatus 100. As an example and not a limitation, a jet orifice surface 136 of a first jet plate 130 may have the jet orifice pattern depicted in FIG. 3B, while a second jet orifice surface 136 of a second jet plate 130 may have an array of cross-shaped jet orifices that are arranged in an array. Still, a third jet orifice surface 136 of a jet plate 130 may have circular jet orifices that are arranged in a circular pattern rather than a square array. In this manner, multiple jet orifice patterns may be tested and evaluated simultaneously. As an example and not a limitation, each jet orifice pattern may be unique amongst the jet orifice surfaces 136 of the plurality of jet plates 130. Jet orifice 130 shapes may include, but are not limited to, circular, elliptical, star-shaped, cross-shaped, rectangular, lobed, helical, and the like. The jet orifices 130 may be arranged in any pattern. Additionally, it should be understood that embodiments may also include jet orifice surfaces having a single orifice to provide for a single jet design.

Although the illustrated jet plate 130 is shown as having a flange portion 133, in alternative embodiments the upper portion is tapered and conical in shape rather than configured as a flange. The upper portion (e.g., the flange portion 133) may be configured as any shape that secures the jet plate 130 to the jet plate manifold 140 within the jet plate openings 142.

Figure 4A:
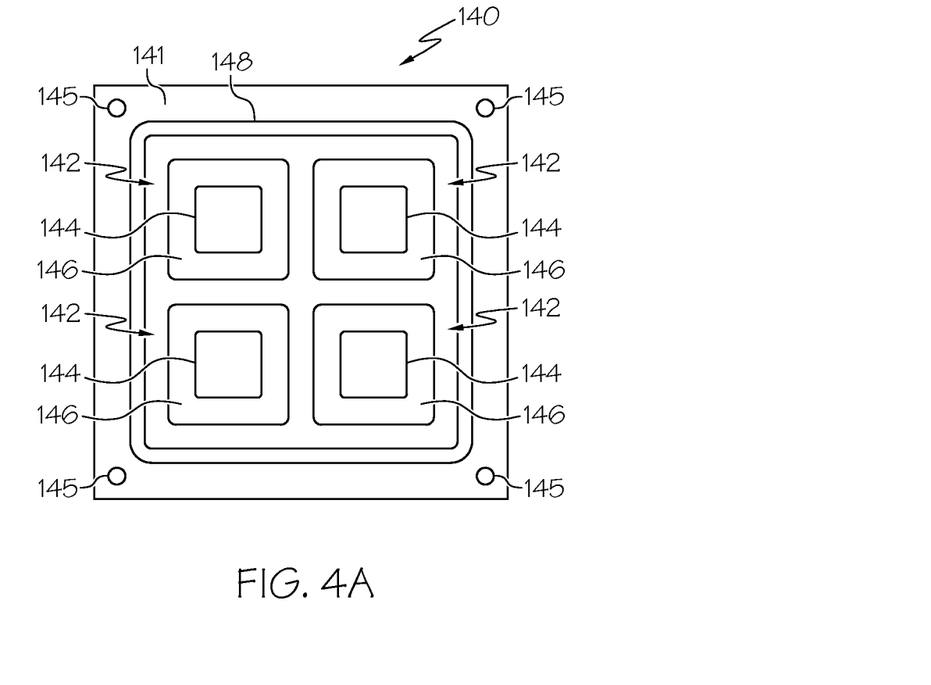
FIG. 4A schematically depicts a top view of an exemplary jet plate manifold according to one or more embodiments described and illustrated herein.
Figure 4B:
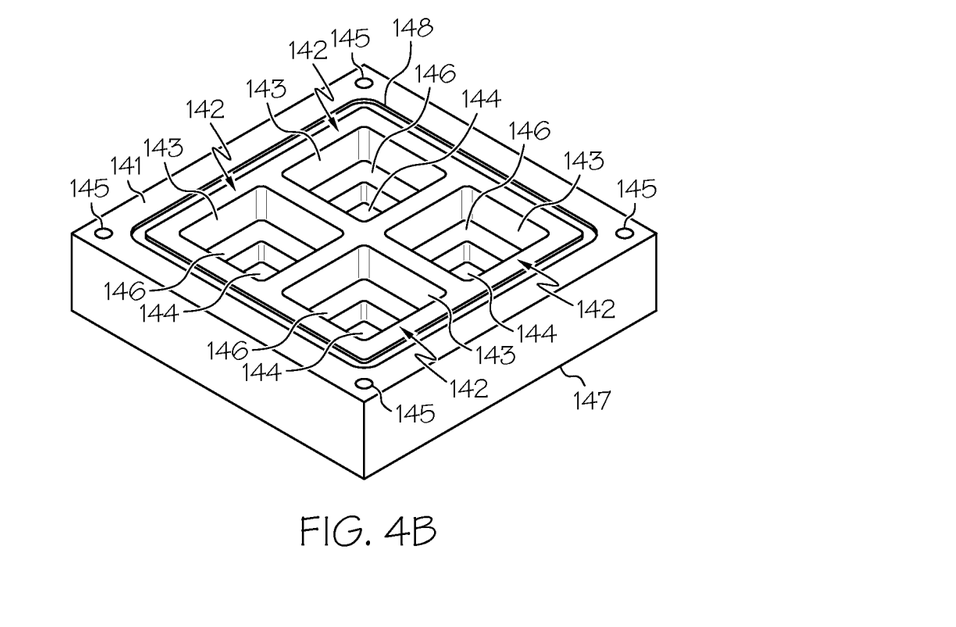
FIG. 4B schematically depicts a top perspective view of the jet plate manifold depicted in FIG. 4A.

Referring now to FIGS. 1 and 4A-4B, an exemplary jet plate manifold 140 is schematically depicted. FIG. 4A is a top view of the jet plate manifold 140, while FIG. 4B is a top perspective view of the jet plate manifold 140 depicted in FIG. 4A. The jet plate manifold 140 comprises a plurality of jet plate openings 142 (i.e., jet nozzle openings) that is configured to receive a plurality of jet plates 130, as shown in FIG. 1. The jet plate manifold 140 may be removably coupled to the fluid inlet manifold 120 via four through-holes 145 and fasteners (not shown). As stated above, the jet plate manifold 140 may be removably coupled to the fluid inlet manifold 120 by other means (e.g., clamps). In some embodiments, a groove 148 may be provided in a top surface 141 of the jet plate manifold 140 to receive a gasket (not show) to prevent coolant fluid from leaking out of the cooling apparatus 100.

Four jet plate openings 142 are depicted in an array in FIGS. 1 and 4A-4B. However, it should be understood that more or fewer jet plate openings 142 may be provided depending on the number of jet plates 130 that are to be evaluated using the cooling apparatus 100, and that the jet plate openings 142 may be arranged in a different configuration from the arrangement depicted in FIGS. 1 and 4A-4B. Each jet plate opening 142 is defined by a square first opening 143 in a top surface 141 of the jet plate manifold 140. Although the first opening 143 is configured as a square, embodiments are not limited thereto. The shape of the first opening 143 may be configured to match the geometry of the upper portion of the jet plates 130. For example, the shape of the jet plate openings 142 may be configured according to the shape of the jet plates 130, and may take on shapes other than squares, such as rectangles, circles, ovals, etc.

Figure 7:
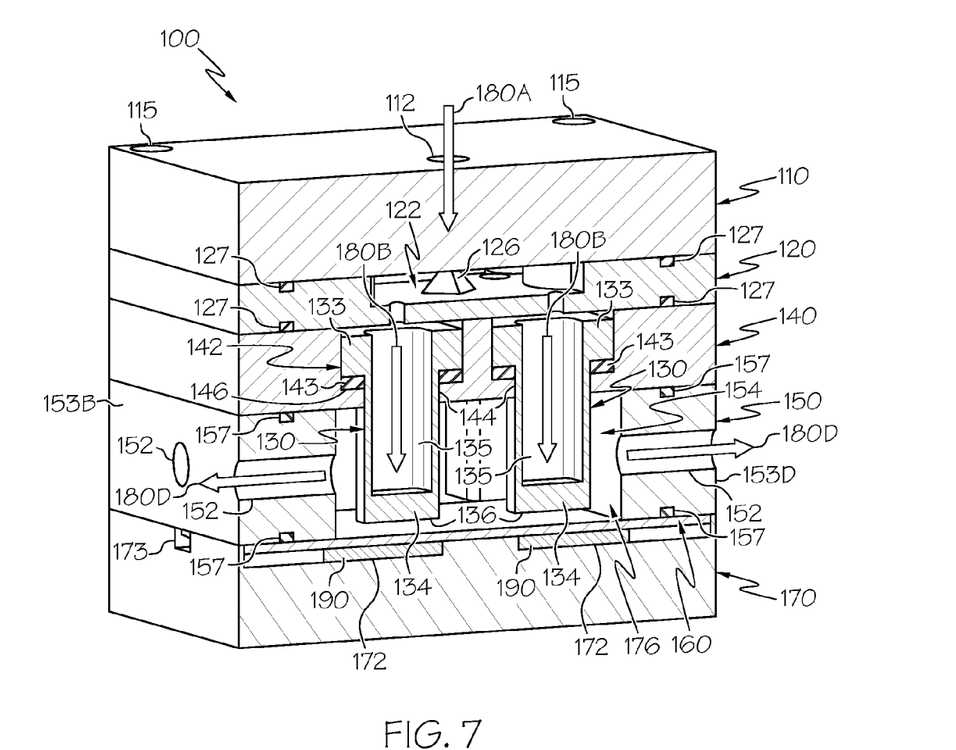
FIG. 7 schematically depicts a cross-sectional view of an assembled cooling apparatus according to one or more embodiments described and illustrated herein.

In the illustrated embodiment, the first opening 143 narrows to a second opening 144 that extends through an underside surface 147 of the jet plate manifold 140. The transition from the first opening 143 to the second opening 144 forms a seat 146 along a perimeter within the jet plate opening 142. As shown in FIG. 7, which is a cross-sectional view of an assembled exemplary cooling apparatus 100, the flange portion 133 of each jet orifice 130 is positioned on the seat 146 defined by the transition between the first opening 143 and the second opening 144 of the respective jet plate openings 142. In some embodiments, a jet plate gasket (not shown) may be positioned between the flange portion 133 and the seat 146. Accordingly, the plurality of jet plates 130 is positioned within the plurality of jet plate openings 142 of the jet plate manifold 140. The jet plate openings 142 are arranged such that the jet channels 135 of the jet plates 130 are vertically aligned with the fluid distribution channels 124 of the fluid inlet manifold 120 when the plurality of jet plates 130 is disposed in the plurality of jet plate openings 142 and the fluid inlet manifold 120 is coupled to the jet plate manifold 140.

In alternative embodiments wherein the upper portion of each jet plate 130 is conical (rather than a flange portion 133), the first opening of the jet plate opening may taper to the narrower second opening according to the geometry of the jet plates. In this manner, the plurality of jet plates may be maintained within the plurality of jet plate openings of the jet plate manifold.

Figure 5A:
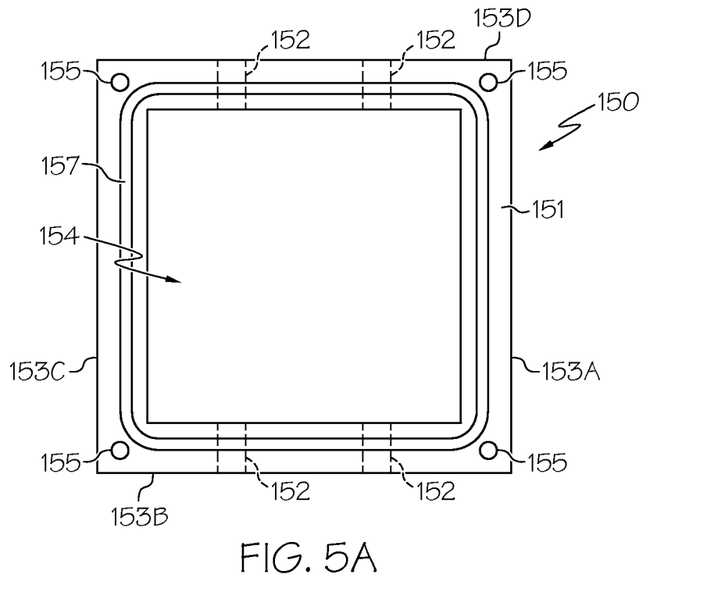
FIG. 5A schematically depicts a top view of an exemplary vapor manifold according to one or more embodiments described and illustrated herein.
Figure 5B:
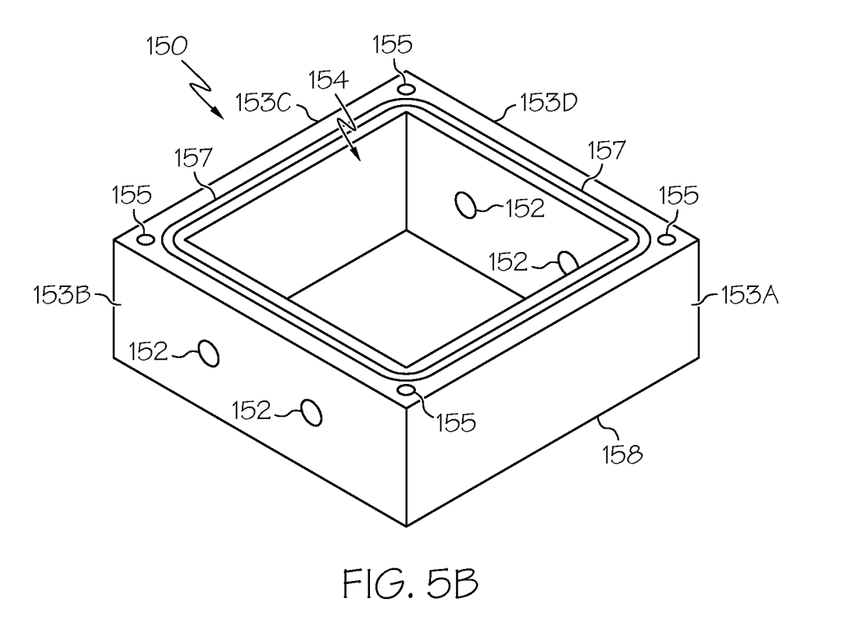
FIG. 5B schematically depicts a top perspective view of the vapor manifold depicted in FIG. 5A.

Referring now to FIGS. 1 and 5A-5B, an exemplary vapor manifold 150 is schematically depicted. FIGS. 5A and 5B are top and top perspective views of the vapor manifold 150 depicted in FIG. 1, respectively. The vapor manifold 150 may be removably coupled to the jet plate manifold 140 via through-holes 155 and fasteners, or by alternative methods as described above. A groove 157 may be provided around a perimeter of the top surface 151 and the underside surface 158 of the vapor manifold 150 to receive gaskets (not shown) to prevent coolant fluid from leaking out of the cooling apparatus 100.

The illustrated vapor manifold 150 comprises a plurality of walls 153A-153D that defines a vapor manifold opening 154. One or more outlet channels 152 may be provided through one or more walls of the plurality of walls 153A-153D. The one or more outlet channels 152 are open at the vapor manifold opening 154 and at an external surface of the cooling apparatus 100, thereby providing an exit path for coolant fluid in the form of liquid and/or vapor from the cooling apparatus 100. In the illustrated embodiment, two outlet channels 152 are provided through wall 153B and two outlet channels 152 are provided through wall 153D. However, it should be understood that any number of outlet channels 152 may be provided through any number of walls 153A-153D.

As depicted in FIG. 7 and described in more detail below, the vapor manifold opening 154 is configured to accept the narrow portion 134 and the jet orifice surface 136 of the jet plates 130.

Referring once again to FIG. 1, the target layer 160 is removably coupled to an underside surface 158 of the vapor manifold 150. For example, the illustrated target layer 160 includes through-holes 165 for receiving fasteners to couple the target layer 160 to the vapor manifold 150. As described above, other coupling methods may be utilized. The target layer 160 may be fabricated from a thermally conductive material, such as copper or aluminum, for example.

Referring now to FIG. 7, the jet orifice surface 136 of each jet plate 130 is positioned above the target layer 160 such that impingement jets flowing out of the jet orifices 138 strike the target layer 160. In some embodiments, the target layer 160 further includes surface features (not shown) that extend from a surface of the target layer 160 to enhance heat transfer to the coolant fluid. The target layer 160, as well as any surface enhancement features, if present, may be roughened or porous to increase the number of nucleation sites and promote nucleate boiling of the coolant fluid, as described in more detail below.

Figure 6A:
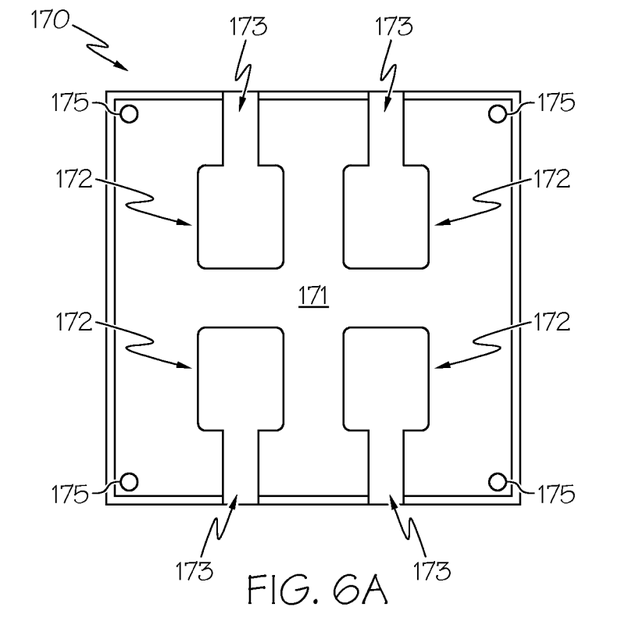
FIG. 6A schematically depicts a top view of an exemplary insulation assembly according to one or more embodiments described and illustrated herein.
Figure 6B:
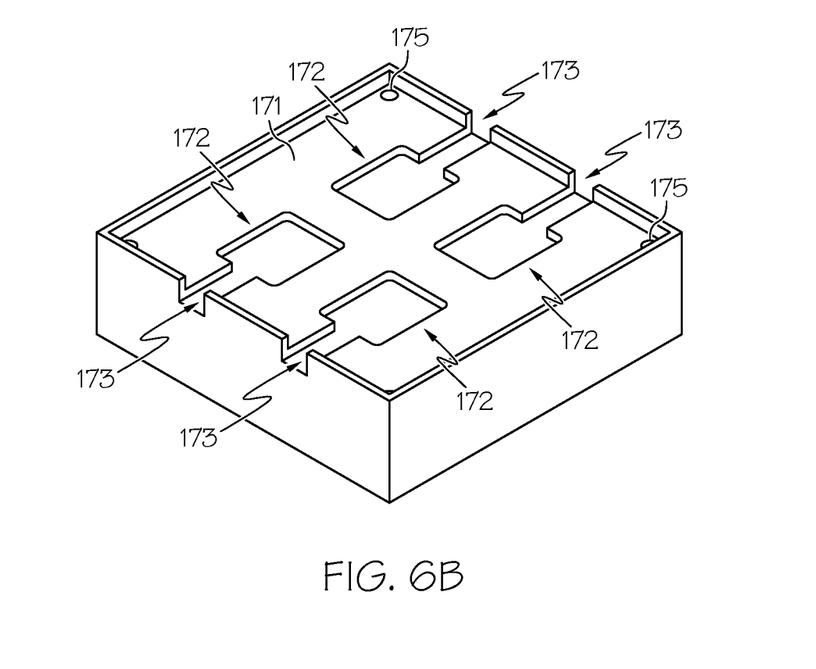
FIG. 6B schematically depicts a top perspective view of the insulation assembly depicted in FIG. 6A.

As shown in FIGS. 1 and 7, the insulation assembly 170 is configured to receive the target layer 160. FIGS. 6A and 6B schematically depict a top view and a top perspective view, respectively of the insulation assembly 170 depicted in FIG. 1. The insulation assembly 170 may be removably coupled to the target layer 160 by through-holes 175 (or blind bores) and fasteners, or by other coupling means as described above. In some embodiments, the insulation assembly 170 is permanently bonded (e.g., by a braze or solder joint) to the vapor manifold 150.

In the illustrated embodiment, the insulation assembly 170 includes a recessed area 171 into which the target layer 160 is disposed. The illustrated insulation assembly 170 further includes a plurality of device recesses 172 that is configured to accept a plurality of heat generating devices 190 (see FIG. 7), such as a plurality of semiconductor devices. It should be understood that more or fewer device recesses 172 may be provided. The target layer 160 is thermally coupled to the heat generating device 190. In some embodiments, a thermal interface material, such as thermal paste, is positioned between the heat generating device 190 and the target layer 160. The illustrated insulation assembly 170 further includes a notch 173 at each device recess 172 that allows electrical connections to pass from the heat generating device 190 out of the cooling apparatus 100.

The insulation assembly 170 may be fabricated from any non-electrically conductive material capable of withstanding the high operating temperatures of the heat generating device 190. Exemplary materials include, but are not limited to, solidified polymers (e.g., polyether ether ketone ("PEEK")), ceramic materials (e.g., aluminum nitride), and the like.

Referring now to FIG. 7, a cross-sectional view of an assembled cooling apparatus 100 is schematically depicted. A heat generating device 190 is positioned in each device recess 172 of the insulation assembly 170. The target layer 160 is positioned within the recessed area 171 of the insulation assembly 170. The vapor manifold 150 is coupled to the insulation assembly 170 and the target layer 160. The jet plate manifold 140 is coupled to the vapor manifold 150.

As described above, the cooling apparatus 100 allows for jet plates 130 having different jet orifice patterns to be provided in the jet plate openings 142 of the jet plate manifold 140 for testing and evaluation purposes. Jet plates 130 may be easily exchanged to evaluate the cooling performance of different jet orifice patterns. The jet plates 130 may be installed into the cooling apparatus 100 by positioning the flange portion 133 of the jet plates 130 on the seats 146 of the jet plate openings 142. In some embodiments, a gasket (not shown) may be provided between the flange portion 133 and the seat 146.

After the desired jet plates 130 have been inserted into the jet plate openings 142 of the jet plate manifold 140, the inlet manifold 120 is positioned on the jet plate manifold 140, and the fluid inlet layer 110 is positioned on the inlet manifold 120. The fluid inlet layer 110, the inlet manifold 120, the jet plate manifold 140, the vapor manifold 150, the target layer 160 and the insulation assembly 170 may be maintained in a removably coupled arrangement by providing fasteners (e.g., screws or bolts and nuts) through the through-holes of the various layers (e.g., through-holes 115 of the fluid inlet layer 110).

When the cooling apparatus 100 is fully assembled, the fluid inlet 112 is vertically aligned with the fluid routing feature 126, and the plurality of fluid distribution channels 124 is vertically aligned with the jet channels 135 of the plurality of jet plates 130. The narrow portion 134 of each jet plate 130 is positioned within the vapor manifold opening 154 of the vapor manifold 150.

Coolant fluid, such as deionized water or other appropriate liquid, is introduced into the cooling apparatus 100 through the fluid inlet 112 as indicated by arrow 180A. The coolant fluid may originate from a coolant fluid reservoir, for example. After flowing through the fluid inlet layer 110, the stream of coolant fluid strikes the fluid routing feature 126 that directs the coolant fluid toward each of the fluid distribution channels 124. The fluid routing feature 126 and the curved perimeter wall 129 ensure that the fluid flow of the coolant fluid is substantially the same at each fluid distribution channel 124.

The coolant fluid then flows into and through the fluid distribution channels 124 and enters the jet channels 135 of the jet plates 130 as indicated by arrows 180B. The coolant fluid exits each jet plate 130 at the jet orifice surface through the jet orifices 138 as impingement jets. The number and arrangement of impingement jets that exit each jet plate 130 depends on the jet orifice pattern. The impingement jets then impinge the target layer 160 above the heat generating devices 190.

Figure 8:
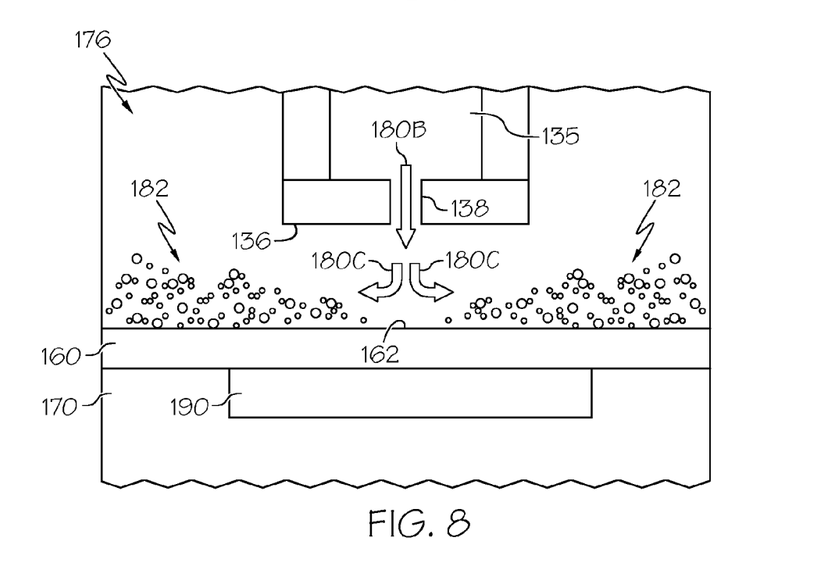
FIG. 8 schematically depicts an impingement jet striking a target layer according to one or more embodiments described and illustrated herein.

FIG. 8 schematically depicts coolant fluid flowing out of a single jet orifice 138 and impinging the target layer 160. Only a single jet orifice 138 is depicted rather than an array of jet orifices for ease of illustration. The coolant fluid flows out of the jet orifices 138 from the jet channel 135 as indicated by arrow 180B and impinges the target layer 160 at an impingement region 162 above the heat generating device 190. After striking the target layer 160, the coolant fluid flows away from the impingement region 162, as indicated by arrows 180C. The high temperature of the heat generating device 190, which may be a power semiconductor device, for example, causes some of the coolant fluid to change from a liquid to a vapor by nucleate boiling. Vapor bubbles 182 form within the coolant fluid in an impingement chamber 176 defined by the target layer 160, the vapor manifold 150, and the jet plate manifold 140. The nucleate boiling provided two-phase heat transfer. In some embodiments, the target layer 160 is roughened or porous to enhance the formation of vapor bubbles 182. Due to body forces of the coolant fluid flowing within the impingement chamber 176, the vapor bubbles 182, as well as liquid coolant fluid, is forced outward toward the walls 153A-153D of the vapor manifold 150. The coolant fluid, in the form of liquid and vapor, enters the outlet channels 152 and exits the cooling apparatus 100 as indicated by arrows 180D in FIG. 7.

The cooling performance of the jet plates 130 may be evaluated during experimentation and testing. After evaluating one or more jet plates, the cooling apparatus 100 may be disassembled, and different jet plates 130 inserted into the jet plate manifold 140 for evaluation.

It should now be understood that embodiments of the present disclosure are directed to modular cooling apparatuses that may be used to evaluate different jet plates. Jet orifice plates having jet orifice surfaces of various designs may be easily exchanged and evaluated. Embodiments described herein facilitate experimental investigation by reducing the number of components that need to be fabricated to test different jet impingement patterns and geometries.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling apparatus comprising:
   an inlet manifold comprising:
      a fluid distribution chamber; and
      a plurality of fluid distribution channels symmetrically located within the fluid distribution chamber;
   a jet nozzle manifold comprising a plurality of jet nozzle openings, wherein the jet nozzle manifold is coupled to the inlet manifold such that the plurality of jet nozzle openings is vertically aligned with respect to the plurality of fluid distribution channels;
   a plurality of jet nozzles disposed within the plurality of jet nozzle openings, each jet nozzle of the plurality of jet nozzles comprising:
      a jet orifice surface comprising one or more jet orifices; and
      a jet channel, wherein the jet channel is fluidly coupled to an individual fluid distribution channel of the plurality of fluid distribution channels, and the coolant fluid flows through the one or more jet orifices as one or more impingement jets;
   a vapor manifold coupled to the jet nozzle manifold, the vapor manifold comprising a plurality of walls defining a vapor manifold opening, and at least one outlet channel through at least one wall of the plurality of walls, wherein at least a portion of each jet nozzle is disposed within the vapor manifold opening; and
   a target layer coupled to the vapor manifold, wherein the jet orifice surface of each jet nozzle is positioned above the target layer.

2. The cooling apparatus of claim 1, wherein the fluid distribution chamber comprises a curved perimeter wall such that a fluid flow of coolant fluid within the fluid distribution chamber is substantially equal at each fluid distribution channel of the plurality of fluid distribution channels.

3. The cooling apparatus of claim 2, further comprising a fluid routing feature centrally positioned on a floor of the fluid distribution chamber, wherein the fluid routing feature receives coolant fluid and directs the coolant fluid toward the plurality of fluid distribution channels.

4. The cooling apparatus of claim 3, wherein the fluid routing feature is a pyramid.

5. The cooling apparatus of claim 1, wherein the one or more jet orifices comprises an array of jet orifices.

6. The cooling apparatus of claim 1, wherein the jet orifice surface of each jet nozzle of the plurality of jet nozzles comprises a jet orifice pattern that is unique amongst the plurality of jet nozzles.

7. The cooling apparatus of claim 1, wherein:
each jet nozzle comprises a flange portion;
each jet nozzle opening comprises a seat;
the plurality of jet nozzles is disposed within the plurality of jet nozzle openings such that the flange portion is positioned on the seat; and
the jet orifice surface is opposite from the flange portion.

8. The cooling apparatus of claim 7, wherein each jet nozzle comprises a narrow portion extending from the flange portion, and the jet orifice surface is located on the narrow portion opposite from the flange portion.

9. A cooling apparatus comprising:
an inlet manifold comprising:
  a fluid distribution chamber;
  a plurality of fluid distribution channels symmetrically located within the fluid distribution chamber;
  a fluid routing feature centrally positioned on a floor of the fluid distribution chamber, wherein the fluid routing feature receives coolant fluid and directs the coolant fluid toward the plurality of fluid distribution channels;
a jet nozzle manifold comprising a plurality of jet nozzle openings, wherein the jet nozzle manifold is coupled to the inlet manifold such that the plurality of jet nozzle openings is vertically aligned with respect to the plurality of fluid distribution channels;
a plurality of jet nozzles removably disposed within the plurality of jet nozzle openings, each jet nozzle of the plurality of jet nozzles comprising:
  a jet orifice surface comprising one or more jet orifices; and
  a jet channel, wherein the jet channel is fluidly coupled to an individual fluid distribution channel of the plurality of fluid distribution channels, and the coolant fluid flows through the one or more jet orifices as one or more impingement jets;
a vapor manifold coupled to the jet nozzle manifold, the vapor manifold comprising a plurality of walls defining a vapor manifold opening, and at least one outlet channel through at least one wall of the plurality of walls, wherein at least a portion of each jet nozzle is disposed within the vapor manifold opening; and
a target layer coupled to the vapor manifold, wherein the jet orifice surface of each jet nozzle is positioned above the target layer.

10. The cooling apparatus of claim 9, wherein the fluid distribution chamber comprises a curved perimeter wall such that a fluid flow of coolant fluid within the fluid distribution chamber is substantially equal at each fluid distribution channel of the plurality of fluid distribution channels.

11. The cooling apparatus of claim 9, wherein the jet orifice surface of each jet nozzle of the plurality of jet nozzles comprises a jet orifice pattern that is unique amongst the plurality of jet nozzles.

12. The cooling apparatus of claim 9, wherein:
the inlet manifold is removably coupled to the jet nozzle manifold;
the jet nozzle manifold is removably coupled to the vapor manifold; and
the vapor manifold is removably coupled to the target layer.

13. A cooling apparatus comprising:
a fluid inlet layer comprising a fluid inlet;
an inlet manifold comprising:
  a fluid distribution chamber; and
  a plurality of fluid distribution channels, wherein the plurality of fluid distribution channels is symmetrically located within the fluid distribution chamber, and the inlet manifold is coupled to the fluid inlet layer such that the fluid inlet is fluidly coupled to the fluid distribution chamber;
a jet nozzle manifold comprising a plurality of jet nozzle openings, each jet nozzle opening comprising a seat, wherein the jet nozzle manifold is coupled to the inlet manifold such that the plurality of jet nozzle openings is vertically aligned with respect to the plurality of fluid distribution channels;
a plurality of jet nozzles removably disposed within the plurality of jet nozzle openings, each jet nozzle of the plurality of jet nozzles comprising:
  a flange portion, wherein the plurality of jet nozzles is disposed within the plurality of jet nozzle openings such that the flange portion is positioned on the seat;
  a jet orifice surface opposite from the flange portion, wherein the jet orifice surface comprises one or more jet orifices; and
  a jet channel, wherein the jet channel is fluidly coupled to an individual fluid distribution channel of the plurality of fluid distribution channels, and the coolant fluid flows through the one or more jet orifices as one or more impingement jets;
a vapor manifold coupled to the jet nozzle manifold, the vapor manifold comprising a plurality of walls defining a vapor manifold opening, and at least one outlet channel through at least one wall of the plurality of walls, wherein at least a portion of each jet nozzle is disposed within the vapor manifold opening;
a target layer coupled to the vapor manifold, wherein the jet orifice surface of each jet nozzle is positioned above the target layer; and
an insulation assembly coupled to the target layer, the insulation assembly comprising a plurality of recesses for receiving a plurality of heat generating devices.

14. The cooling apparatus of claim 13, wherein the fluid distribution chamber comprises a curved perimeter wall such that a fluid flow of coolant fluid within the fluid distribution chamber is substantially equal at each fluid distribution channel of the plurality of fluid distribution channels.

15. The cooling apparatus of claim 13, further comprising a fluid routing feature vertically aligned with the fluid inlet, wherein the fluid routing feature receives coolant fluid from the fluid inlet, and directs the coolant fluid toward the plurality of fluid distribution channels.

16. The cooling apparatus of claim 15, wherein the fluid routing feature is a pyramid.

17. The cooling apparatus of claim 13, wherein the one or more jet orifices comprises an array of jet orifices.

18. The cooling apparatus of claim 13, wherein the jet orifice surface of each jet nozzle of the plurality of jet nozzles comprises a jet orifice pattern that is unique amongst the plurality of jet nozzles.

19. The cooling apparatus of claim 13, wherein each jet nozzle comprises a narrow portion extending from the flange portion, and the jet orifice surface is located on the narrow portion opposite from the flange portion.

20. The cooling apparatus of claim 13, wherein:
the inlet manifold is removably coupled to the jet nozzle manifold;
the jet nozzle manifold is removably coupled to the vapor manifold; and
the vapor manifold is removably coupled to the target layer.

* * * * *